United States Patent
Mehdizad Taleie et al.

(10) Patent No.: US 10,516,412 B1
(45) Date of Patent: Dec. 24, 2019

(54) IMAGE CALIBRATION FOR TIME-INTERLEAVED DIGITAL-TO-ANALOG CONVERTER

(71) Applicant: QUALCOMM INCORPORATED, San Diego, CA (US)

(72) Inventors: Shahin Mehdizad Taleie, San Diego, CA (US); Ashok Swaminathan, Cardiff, CA (US); Sudharsan Kanagaraj, San Diego, CA (US); Negar Rashidi, Irvine, CA (US); Siyu Yang, San Diego, CA (US); Behnam Sedighi, La Jolla, CA (US); Honghao Ji, San Diego, CA (US); Jaswinder Singh, San Diego, CA (US); Andrew Weil, San Diego, CA (US); Dongwon Seo, San Diego, CA (US); Xilin Liu, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/138,499

(22) Filed: Sep. 21, 2018

(51) Int. Cl.
*H03M 1/66* (2006.01)
*G04F 10/00* (2006.01)
*H03M 1/68* (2006.01)

(52) U.S. Cl.
CPC .......... *H03M 1/662* (2013.01); *G04F 10/005* (2013.01); *H03M 1/68* (2013.01)

(58) Field of Classification Search
CPC .......... H03M 1/662; H03M 1/68; H03M 1/66; H03M 1/747; H03M 1/00; G04F 10/005
USPC ........................................................ 341/144
See application file for complete search history.

(56) References Cited

U.S. PATENT DOCUMENTS

| | | | | |
|---|---|---|---|---|
| 7,187,310 B2* | 3/2007 | El-Sankary | ......... | H03M 1/1004 341/118 |
| 7,312,737 B2* | 12/2007 | Jungerman | ........... | H03M 1/662 341/141 |
| 7,561,095 B2* | 7/2009 | Sasaki | ................... | H03M 1/002 341/122 |
| 7,941,686 B2* | 5/2011 | Fujisawa | ................... | H03L 7/00 713/300 |
| 8,497,790 B1* | 7/2013 | Lewis | ................. | H03M 1/1019 341/118 |
| 8,773,296 B1 | 7/2014 | Dusatko et al. | | |

(Continued)

OTHER PUBLICATIONS

McCue J.J., et al., "A Time-Interleaved Multimode ΔΣ RF-DAC for Direct Digital-to-RF Synthesis", IEEE Journal of Solid-State Circuits, May 2016, vol. 51, No. 5, pp. 1109-1124.

*Primary Examiner* — Jean B Jeanglaude
(74) *Attorney, Agent, or Firm* — Smith Tempel Blaha LLC/Qualcomm

(57) ABSTRACT

An interleaved digital-to-analog converter (DAC) system may include a first sub-DAC and a second sub-DAC and may be configured to provide both a converter output signal and a calibration output signal. The converter output signal may be provided by adding the first sub-DAC output signal and the second sub-DAC output signal. The calibration output signal may be provided by subtracting one of the first and second sub-DAC output signals from the other. The calibration output signal may be used as feedback to adjust the phase of one of the sub-DACs relative to the other, to promote phase matching their output signals.

29 Claims, 14 Drawing Sheets

(56) References Cited

U.S. PATENT DOCUMENTS

| | | | |
|---|---|---|---|
| 9,007,250 B1 * | 4/2015 | Jeraj | H03M 1/662 |
| | | | 341/144 |
| 9,178,528 B1 | 11/2015 | Waltari | |
| 9,621,183 B2 * | 4/2017 | Baringer | H03M 3/46 |
| 9,871,504 B2 | 1/2018 | Clara et al. | |
| 9,973,203 B1 * | 5/2018 | Azenkot | H03M 1/74 |
| 2008/0198053 A1 * | 8/2008 | Tsang | H03M 1/0678 |
| | | | 341/144 |

* cited by examiner

IMAGE CALIBRATION FOR TIME-INTERLEAVED DIGITAL-TO-ANALOG CONVERTER

FIELD

The present disclosure relates generally to electronics and, more specifically, to time-interleaved digital-to-analog converters.

BACKGROUND

High bandwidth communication systems require high speed digital-to-analog conversion. Time-interleaving two digital-to-analog converters (DACs) is a technique that can help meet high bandwidth requirements. The two DACs may be referred to as DAC cores or sub-DACs. In a time-interleaved DAC, the two sub-DACs may be coupled in parallel and configured to operate alternately at a frequency $F_S$. The clock signals applied to the two sub-DACs may be complementary. For example, the clock signal applied to one of the sub-DACs may be delayed with respect to the clock signal applied to the other sub-DAC by 180 degrees (i.e., $0.5/F_S$). Operating the two sub-DACs in this manner results in the interleaved DAC producing an analog output waveform having an effective sample rate of $2F_S$.

Time skew between the two sub-DACs degrades the image attenuation and the interleaving operation. Such time skew can be caused not only by phase imbalance or skew between the two clock signals but also by integrated circuit process variation between the two sub-DACs. It is desirable to reduce the phase imbalance or skew between the sub-DACs of a time-interleaved DAC and hence improve the image attenuation.

SUMMARY

Various implementations of systems, methods, and apparatuses within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an interleaved digital-to-analog converter (DAC) system. The interleaved DAC system may include a first sub-DAC and a second sub-DAC. The first sub-DAC may have a data input configured to receive a digital signal, a clock input configured to receive a clock signal, and a first sub-DAC output configured to provide a first sub-DAC output signal. The second sub-DAC may have a data input configured to receive the digital signal, a clock input configured to receive a complement of the clock signal, and a second sub-DAC output configured to provide a second sub-DAC output signal. The interleaved DAC system may further include an output circuit coupled to the first sub-DAC output and the second sub-DAC output. The output circuit may be configured to provide anoutput signal representing a difference between the first sub-DAC output signal and the second sub-DAC output signal.

Another aspect of the disclosure provides an interleaved DAC apparatus. The interleaved DAC apparatus may include means for converting a digital signal to a first sub-DAC output signal in response to a clock signal. The interleaved DAC apparatus may also include means for converting the digital signal to a second sub-DAC output signal in response to a complement of the clock signal. The interleaved DAC apparatus may further include means for providing an output signal representing a difference between the first sub-DAC output signal and the second sub-DAC output signal.

Still another aspect of the disclosure provides a method for operation of an interleaved DAC system. The method may include converting a digital signal using a first sub-DAC to a first sub-DAC output signal in response to a clock signal. The method may also include converting the digital signal using a second sub-DAC to a second sub-DAC output signal in response to a complement of the clock signal. The method may further include providing an output signal by subtracting one of the first sub-DAC output signal and the second sub-DAC output signal from the other of the first sub-DAC output signal and the second sub-DAC output signal.

BRIEF DESCRIPTION OF THE DRAWINGS

In the drawings, like reference numerals refer to like parts throughout the various views unless otherwise indicated. For reference numerals with letter character designations such as "102A" or "102B", the letter character designations may differentiate two like parts or elements present in the same figure. Letter character designations for reference numerals may be omitted when it is intended that a reference numeral to encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects. The word "coupled" is used herein to mean connected through zero or more intermediate elements. The term "connected directly" is used herein to mean connected through no intermediate elements.

Digital to analog conversion is an important function in high bandwidth wireless communication systems, such as 4G and 5G systems. A wireless communication system handset or other user equipment (UE) commonly includes at least one digital-to-analog converter (DAC). Conventional DACs having architectures sufficiently economical for use in UE chipsets may be unable to operate properly at the high rates (e.g., on the order of gigahertz) required in 5G communication systems. Interleaved DAC architectures have been developed that may be beneficial in such systems.

Figure 1:
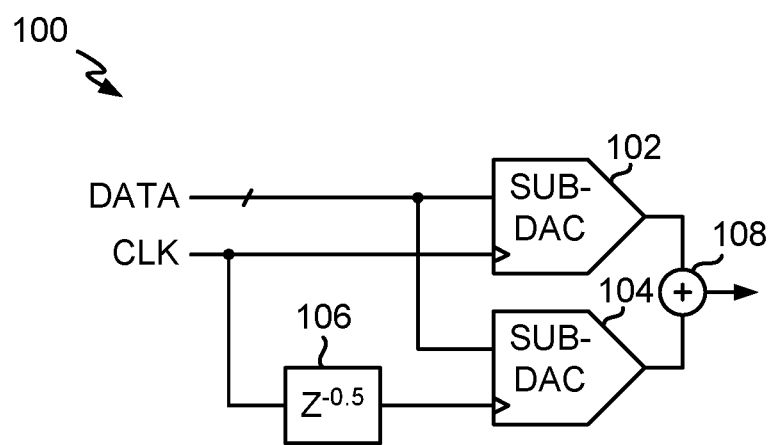
FIG. 1 is a block diagram of an interleaved DAC, in accordance with the prior art.

FIG. 1 illustrates a conventional interleaved DAC 100 that includes two DAC cores or sub-DACs 102 and 104. Each of sub-DACs 102 and 104 has a data input and a clock signal input. Although not shown for purposes of clarity, the data input may be two or more bits wide. A clock signal is provided to the clock input of one of sub-DACs 102 and 104, and the complement of the clock signal is provided to the other of the sub-DACs 102 and 104. For example, an inverter 106 may be coupled to the clock input of one of sub-DACs 102 and 104. In accordance with symbology commonly used in computer simulation models, the notation "$Z^{-0.5}$" may represent a 180-degree phase delay. Thus, for example, the clock signal provided to sub-DAC 104 may be delayed in phase from the clock signal provided to sub-DAC 102 by 180 degrees or $0.5/F_S$, where $F_S$ is the frequency of the data and clock signals. Sub-DACs 102 and 104 operate in an alternating or interleaved manner, in response to complementary (i.e., 180 degree-apart) clock edges. The analog outputs of sub-DACs 102 and 104 are provided to an adder or similar summing circuit 108. Summing circuit 108 thus provides an analog output waveform having an effective sample rate of $2F_S$.

Figure 2:
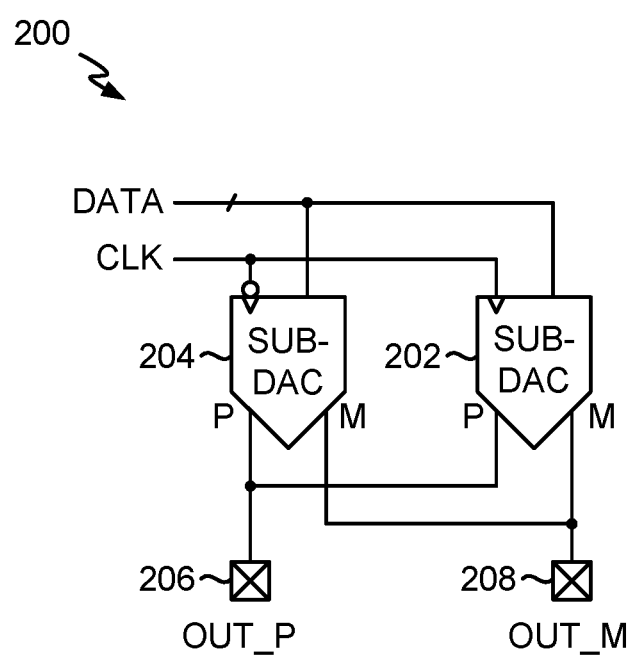
FIG. 2 is a block diagram of another interleaved DAC, in accordance with the prior art.

FIG. 2 illustrates a conventional interleaved DAC 200 that includes two sub-DACs 202 and 204. Each of sub-DACs 202 and 204 has a data input and a clock signal input. Although not shown for purposes of clarity, the data input may be two or more bits wide. A clock signal is provided to the clock input of one of sub-DACs 202 and 204 and to an inverting clock input of the other of the sub-DACs 202 and 204. Such an inverting clock input is similar to the clock input having the inverter 106 described above with regard to FIG. 1. The analog outputs of sub-DACs 202 and 204 provide differential, i.e., positive ("P") and negative ("M") signals in the form of currents. It should be noted that the terms "positive" and "negative" are used herein for convenience only to refer to complementary or differential signals and not to imply any other limitations. The terms "true" and "complement" may alternatively be used to refer to such complementary or differential signals. The positive and negative current signals ("OUT_P" and "OUT_M," respec-tively) are provided to a positive summing node 206 and a negative summing node 208, respectively, to effectively provide the function of summing circuit 108 (FIG. 1). The data and clock signal may have a frequency of $F_S$, and the analog output waveform at the summing nodes 206 and 208 thus may have an effective sample rate of $2F_S$.

A conventional interleaved DAC may suffer from phase imbalance due to integrated circuit process variation between their constituent sub-DAC pairs. That is, undesirable time skew between the 180 degree-apart edges of signals may impair the interleaved DAC operation. A straightforward method for reducing the time skew may include measuring the time skew and adjusting the operation of the sub-DAC pair to compensate. However, measuring a very small time interval may be problematic or uneconomical. For example, using a high bandwidth analog-to-digital (ADC) converter capable of measuring the time skew directly (i.e., in the time domain) may be uneconomical in some applications, such as in a wireless communications handset or similar portable communications device.

Figure 3:
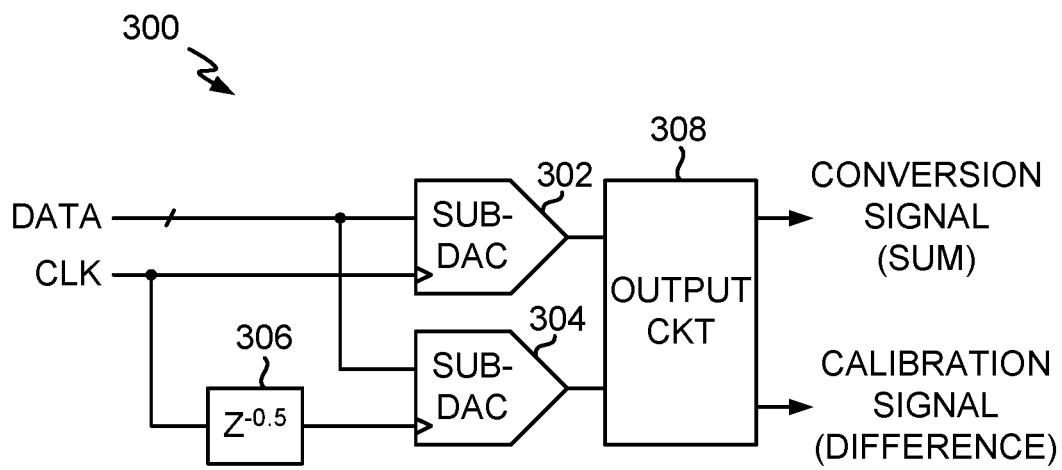
FIG. 3 is a block diagram of an interleaved DAC system, in accordance with an exemplary embodiment.

FIG. 3 illustrates an interleaved DAC system 300 that includes two sub-DACs 302 and 304. Each of sub-DACs 302 and 304 has a data input and a clock signal input. Although not shown for purposes of clarity, the data input may be two or more bits wide. A clock signal is provided to the clock input of one of sub-DACs 302 and 304, and the complement of the clock signal is provided to the other of the sub-DACs 302 and 304 via an inverter 306. The analog outputs of sub-DACs 302 and 304 are provided to an output circuit 308. Output circuit 308 provides a converter output signal or conversion signal representing the sum of the analog outputs of sub-DACs 302 and 304. Output circuit 308 also provides a calibration output signal representing the difference between the analog outputs of sub-DACs 302 and 304.

Figure 4:
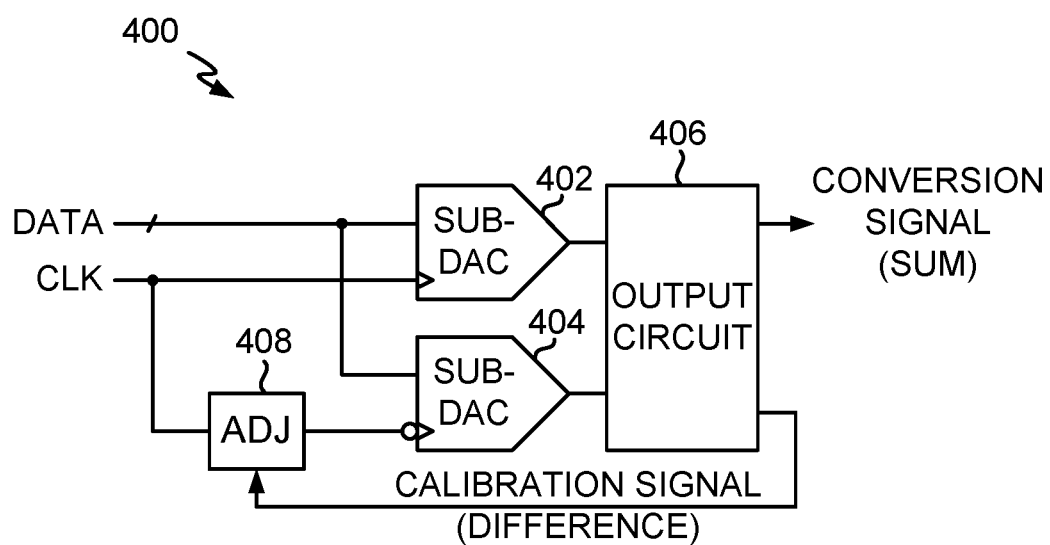
FIG. 4 is a block diagram of another interleaved DAC system, in accordance with an exemplary embodiment.

FIG. 4 illustrates an interleaved DAC system 400 that includes two sub-DACs 402 and 404. Each of sub-DACs 402 and 404 has a data input and a clock signal input. Although not shown for purposes of clarity, the data input may be two or more bits wide. A clock signal is provided to the clock input of one of sub-DACs 402 and 404 and to an inverting clock input of the other of the sub-DACs 402 and 404. Alternatively, an inverter could be included as described above with regard to FIG. 3. The analog outputs of sub-DACs 402 and 404 are provided to an output circuit 406. Output circuit 406 provides a converter output signal or conversion signal representing the sum of the analog outputs of sub-DACs 402 and 404. Output circuit 406 also provides a calibration output signal representing the difference between the analog outputs of sub-DACs 402 and 404.

Output circuit 406 comprises a feedback circuit or portion of a feedback circuit that uses the calibration signal as feedback to adjust the phase of the clock signal provided to at least one of sub-DACs 402 and 404. For example, an adjustable delay 408 may be coupled to the clock signal input of one of sub-DACs 402 and 404. Delay 408 may be adjustable in response to the calibration signal provided by output circuit 406. Delay 408 may be configured to make fine clock phase adjustments, i.e., substantially less than one clock cycle. By adjusting delay 408 in response to the calibration signal, the time skew between the operation of sub-DACs 402 and 404 may be reduced.

Figure 5:
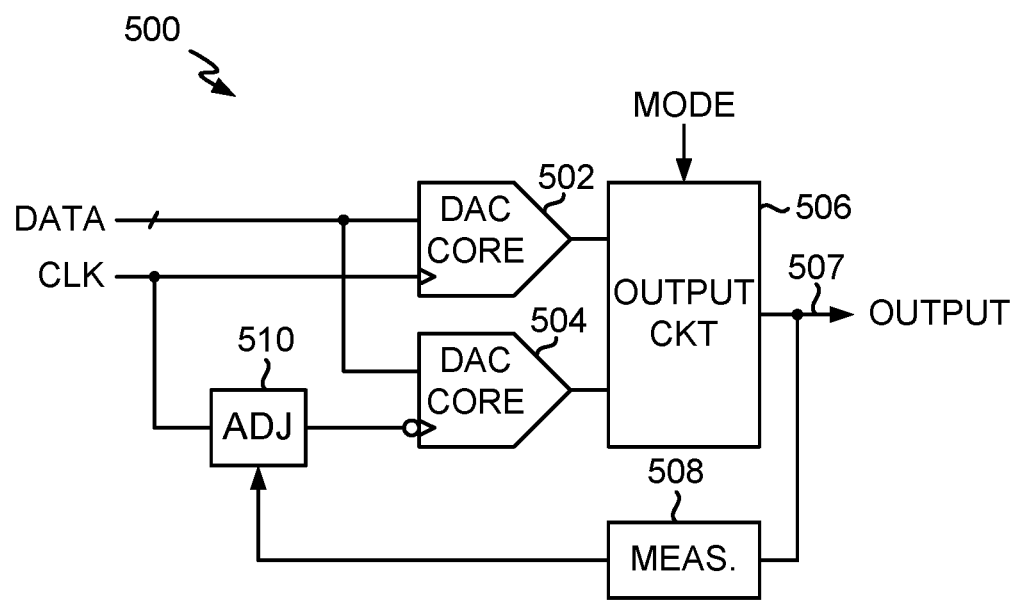
FIG. 5 is a block diagram of still another interleaved DAC system, in accordance with an exemplary embodiment.

FIG. 5 illustrates an interleaved DAC system 500 that includes two sub-DACs 502 and 504 and an output circuit 506. Each of sub-DACs 502 and 504 has a data input and a clock signal input. Although not shown for purposes of clarity, the data input may be two or more bits wide. A clock signal is provided to the clock input of one of sub-DACs 502 and 504 and to an inverting clock input of the other of the sub-DACs 502 and 504. Alternatively, an inverter could be included as described above with regard to FIG. 3. The analog outputs of sub-DACs 502 and 504 are provided to output circuit 506.

Output circuit 506 may comprise a switching circuit. Output circuit 506 has a mode control input that controls a mode switching operation. The mode control input of output circuit 506 is configured to receive a mode control signal having a state indicating one of two modes: a conversion mode and a calibration mode. In response to the mode control signal having a state indicating the conversion mode, output circuit 506 may be configured to provide a converter output signal or conversion signal representing the sum of the analog outputs of sub-DACs 502 and 504. In response to the mode control signal having a state indicating the calibration mode, output circuit 506 may be configured to provide a calibration output signal representing the difference between the analog outputs of sub-DACs 502 and 504. The converter output signal and calibration output signal may both be provided, multiplexed in response to the mode control signal, at an interleaved DAC output 507.

Output circuit 506 comprises a feedback circuit or portion of a feedback circuit that uses the calibration signal as feedback to adjust the phase of the clock signal provided to one or both of sub-DACs 502 and 504. A measurement circuit 508 may be coupled to interleaved DAC output 507. Measurement circuit 508 may be configured to measure the calibration signal, i.e., the difference between the analog outputs of sub-DACs 502 and 504, and to produce a signal representing a measurement of the difference. An adjustable delay 510 may be coupled to the clock signal input of one of sub-DACs 502 and 504. Delay 510 may be adjustable in response to the measurement of the difference. Delay 510 may be configured to make fine clock phase adjustments, i.e., substantially less than one clock cycle. By adjusting delay 510 in response to the measurement of the difference, the time skew between the operation of sub-DACs 502 and 504 may be reduced.

Figure 6:
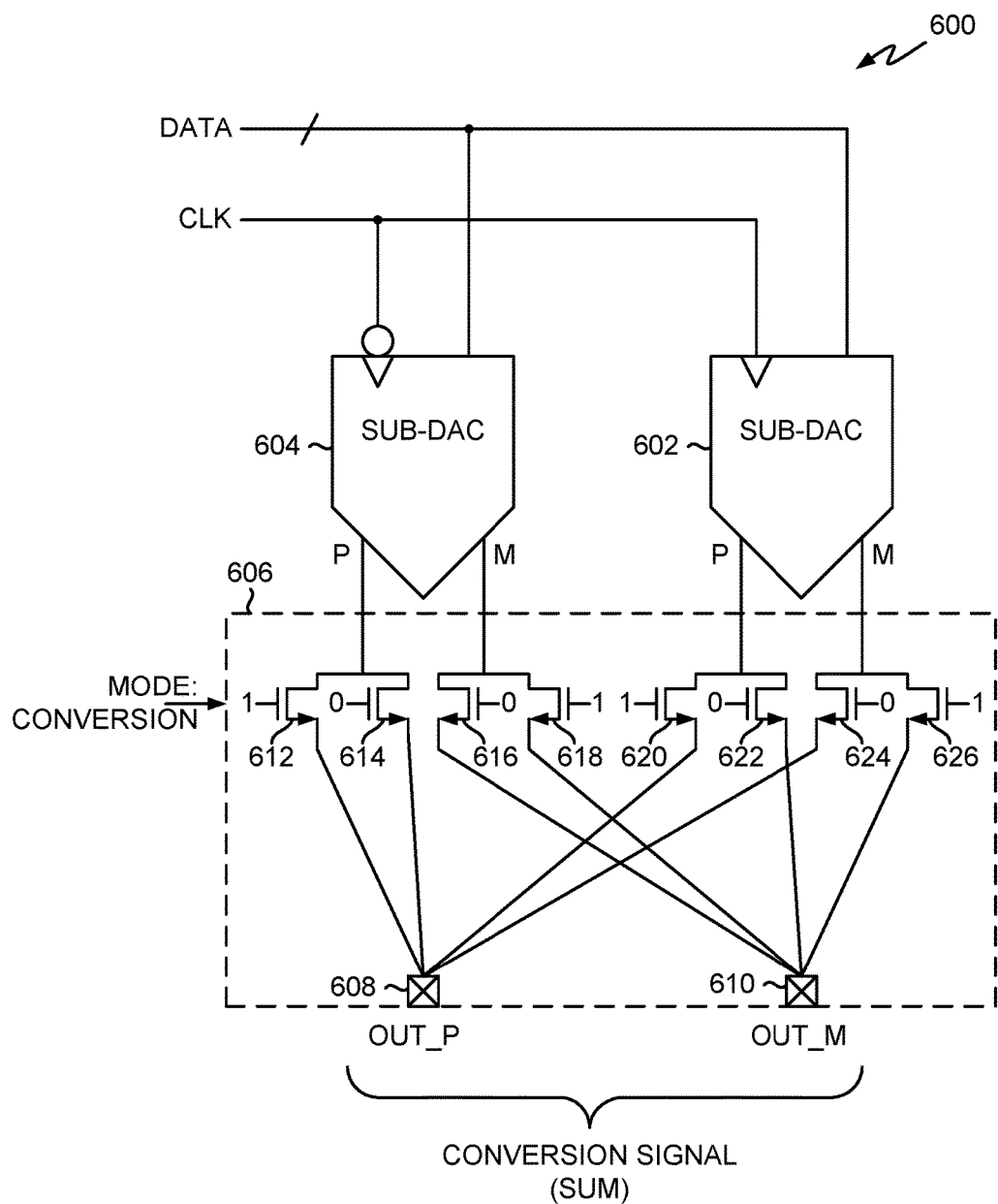
FIG. 6 is a block diagram of yet another interleaved DAC system, showing operation in a conversion mode, in accordance with an exemplary embodiment.

FIG. 6 illustrates an interleaved DAC system 600 that includes two sub-DACs 602 and 604 and an output circuit 606. Each of sub-DACs 602 and 604 has a data input and a clock signal input. Although not shown for purposes of clarity, the data input may be two or more bits wide. A clock signal is provided to the clock input of one of sub-DACs 602 and 604 and to an inverting clock input of the other of the sub-DACs 602 and 604. Alternatively, an inverter could be included as described above with regard to FIG. 3. The analog outputs of sub-DACs 602 and 604 provide differential, i.e., positive and negative, current signals. That is, sub-DAC 602 has a positive output that provides a positive current signal and a negative output that provides a negative current signal. Likewise, sub-DAC 604 has a positive output that provides a positive current signal and a negative output that provides a negative current signal. The analog differential current outputs of sub-DACs 602 and 604 are provided to output circuit 606.

Output circuit 606 may be an example of above-described output circuit 506 (FIG. 5). Output circuit 606 may comprise a switching circuit having an output. The switching circuit may comprise a summing circuit configured to selectively sum differential current signals in the manner described below. Output circuit 606 has a mode control input that controls a mode switching operation. The mode input of output circuit 606 is configured to receive a mode control signal having a state indicating one of two modes: a conversion mode and a calibration mode. In response to the mode control signal having a state indicating the conversion mode, output circuit 606 may be configured to provide a converter output signal or conversion signal representing the sum of the analog outputs of sub-DACs 602 and 604. In response to the mode control signal having a state indicating the calibration mode, output circuit 606 may be configured to provide a calibration output signal representing the difference between the analog outputs of sub-DACs 602 and 604.

Output circuit 606 may include four transistor circuits, each comprising a pair of transistors coupled to one of the outputs of sub-DACs 602 and 604. Output circuit 606 has a differential configuration comprising a positive output node 608 and a negative output node 610. A first transistor circuit may comprise a pair of transistors 612 and 614. Transistor 612, which is configured as a switch controlled by a signal applied to its gate, is coupled between the positive output of sub-DAC 604 and the positive output node 608 of output circuit 606. Transistor 614, which is similarly configured as a switch controlled by a signal applied to its gate, is also coupled between the positive output of sub-DAC 604 and the positive output node 608 of output circuit 606. Although either transistor 612 or 614 could switch the positive output of sub-DAC 604, both transistors 612 and 614 are provided to equalize delays. A second transistor circuit may comprise a pair of transistors 616 and 618. Transistor 616, which is configured as a switch controlled by a signal applied to its gate, is coupled between the negative output of sub-DAC 604 and the negative output node 610 of output circuit 606. Transistor 618, which is similarly configured as a switch controlled by a signal applied to its gate, is also coupled between the negative output of sub-DAC 604 and the negative output node 610 of output circuit 606. Although either transistor 616 or 618 could switch the negative output of sub-DAC 604, both transistors 612 and 614 are provided to equalize delays. A third transistor circuit may comprise a pair of transistors 620 and 622. Transistor 620, which is configured as a switch controlled by a signal applied to its gate, is coupled between the positive output of sub-DAC 602 and the positive output node 608 of output circuit 606. Transistor 622, which is similarly configured as a switch controlled by a signal applied to its gate, is coupled between the positive output of sub-DAC 602 and the negative output node 610 of output circuit 606. A fourth transistor circuit may comprise a pair of transistors 624 and 626. Transistor 624, which is configured as a switch controlled by a signal applied to its gate, is coupled between the negative output of sub-DAC 602 and the positive output node 608 of output circuit 606. Transistor 626, which is similarly configured as a switch controlled by a signal applied to its gate, is coupled between the negative output of sub-DAC 602 and the negative output node 610 of output circuit 606. As described in further detail below, positive output node 608 and negative output node 610 of output circuit 606 are configured as current summing nodes to effect the above-described sum and difference operations. Although in the exemplary embodiment illustrated in FIG. 6 output circuit 606 comprises the above-described transistor circuits and summing circuit, in other embodiments (not shown) such an output circuit may have any other configuration.

Output circuit 606 may be configured to provide a digital code in response to the mode control signal. The bits of the code define the switch control signals applied to transistors 612-626. In response to the mode control signal having a state indicating the conversion mode, output circuit 606 provides a digital code of 10011001, where the bits (in left-to-right order) are applied to transistors 612-626, respectively. That is, in response to the mode control signal having a state indicating the conversion mode: a "1" is applied to the gate of transistor 612; a "0" is applied to the gate of transistor 614; a "0" is applied to the gate of transistor 616; a "1" is applied to the gate of transistor 618; a "1" is applied to the gate of transistor 620; a "0" is applied to the gate of transistor 622; a "0" is applied to the gate of transistor 624; and a "1" is applied to the gate of transistor 626. Thus, in response to the mode control signal having a state indicating the conversion mode, the positive current output of sub-DAC 602 is added to the positive current output of sub-DAC 604 at positive output node 608, and the negative current output of sub-DAC 602 is added to the negative current output of sub-DAC 604 at negative output node 610. Although in the exemplary embodiment illustrated in FIG. 6 the transistor circuits are arranged (e.g., eight transistors 612-626 arranged in four groups) and controlled (e.g., by a digital code) in the manner described above, in other embodiments (not shown) such transistor circuits or other switching circuitry may be arranged and controlled in any other manner.

Figure 7:
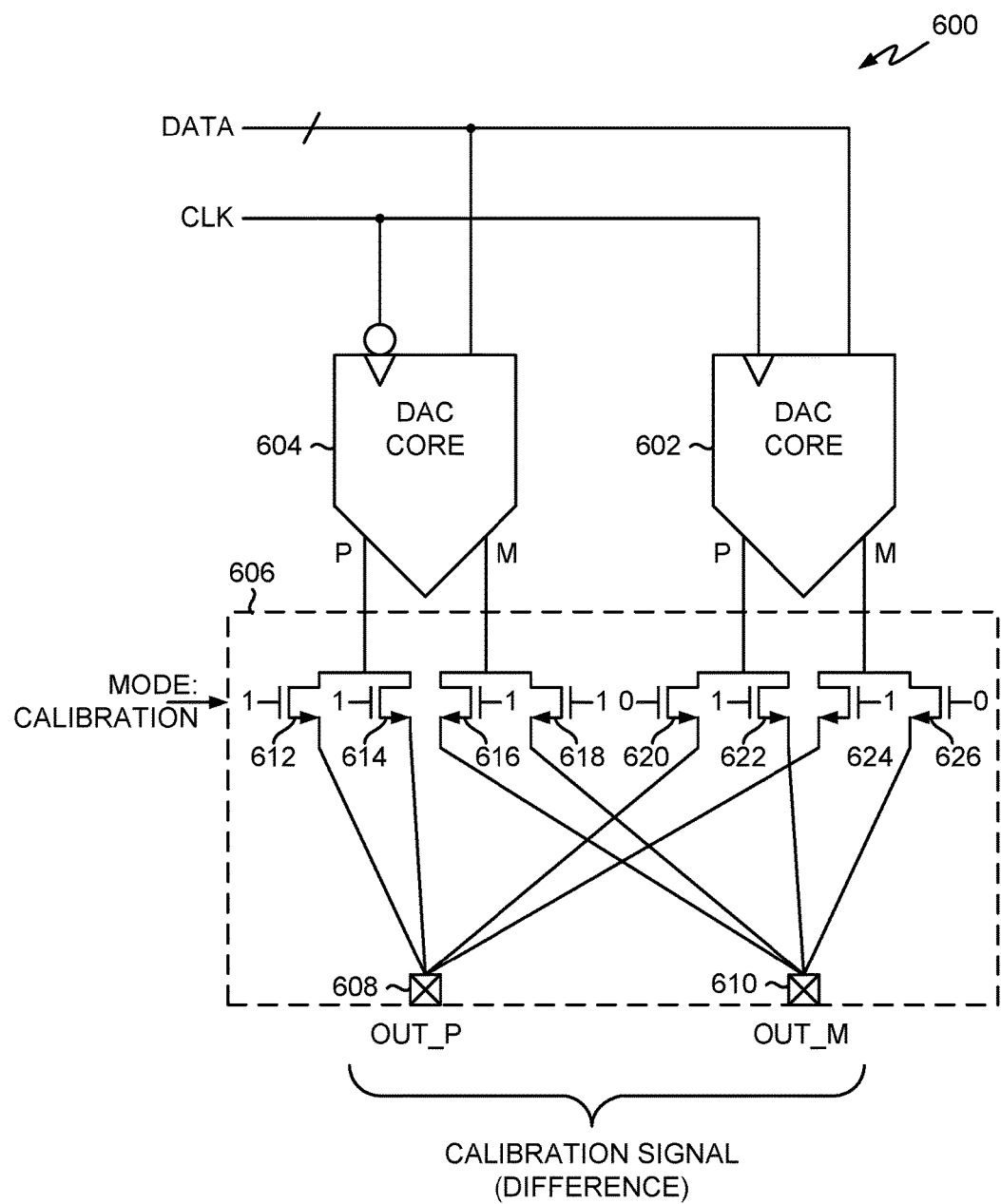
FIG. 7 is a block diagram similar to FIG. 6, showing operation of the DAC system in a calibration mode, in accordance with an exemplary embodiment.

FIG. 7 illustrates the effect on output circuit 606 of selecting the calibration mode instead of the conversion mode. In response to the mode control signal having a state indicating the calibration mode, output circuit 606 provides a digital code of 11110110, where the bits (in left-to-right order) are applied to transistors 612-626, respectively. That is, in response to the mode control signal having a state indicating the calibration mode: a "1" is applied to the gate of transistor 612; a "1" is applied to the gate of transistor 614; a "1" is applied to the gate of transistor 616; a "1" is applied to the gate of transistor 618; a "0" is applied to the gate of transistor 620; a "1" is applied to the gate of transistor 622; a "1" is applied to the gate of transistor 624; and a "0" is applied to the gate of transistor 626. Note that the bits applied in the calibration mode to transistors 612-618, which are coupled to the outputs of sub-DAC 604, are the same as those applied in the conversion mode to transistors 612-618, while the bits applied in the calibration mode to transistors 620-626, which are coupled to the outputs of sub-DAC 602, are the complements of those applied to transistors 620-626 in the conversion mode. Thus, in response to the mode control signal having a state indicating the calibration mode, the positive current output of sub-DAC 602 is added to the negative current output of sub-DAC 604 at positive output node 608, and the positive current output of sub-DAC 602 is added to the negative current output of sub-DAC 604 at negative output node 610. The converter output signal and calibration output signal may both be provided, multiplexed in response to the mode control signal, at an interleaved DAC output defined by positive and negative output nodes 608 and 610.

Output circuit 606 may be included in a feedback circuit as described above with regard to FIGS. 4-5. That is, the positive and negative output nodes 608 and 610, i.e., the interleaved DAC output, may be coupled to an adjustable delay or other element (not shown in FIGS. 6-7 for purposes of clarity) configured to adjust the phase of the clock signal provided to one or both of sub-DACs 602 and 604. The positive and negative output nodes 608 and 610 may be coupled to such an adjustable delay via a measurement circuit (not shown in FIGS. 6-7 for purposes of clarity). By adjusting such a delay in response to the calibration signal, the time skew between the operation of sub-DACs 602 and 604 may be reduced.

When the interleaved DAC system 600 is operating in the conversion mode, the sum of the outputs of sub-DACs 602 and 604 is a small time error that could require complex or uneconomical equipment to measure in the time domain, such as a spectrum analyzer. However, when the interleaved DAC system 600 is operating in the calibration mode, the difference between the outputs of sub-DACs 602 and 604 becomes the amplitude of the tone, which may be readily measured using economical devices, such as an ADC. The term "tone" may be used to refer to the baseband input/output signal of interleaved DAC system 600. The following equations may illustrate this effect.

$$DAC1=X(t), DAC2=X(t-t_d) \quad \text{(Eqn. 1)}$$

where DAC1 and DAC2 are the outputs of sub-DACs 602 and 604, $$t_d = \frac{0.5}{F_S} + \varepsilon, \quad \text{(Eqn. 2)}$$

and $\varepsilon$ is the undesired skew between DAC1 and DAC2.

When the interleaved DAC system 600 is operating in the conversion mode:

$$DAC1+DAC2=X(f)(1+e^{-2\pi f t_d}) \quad \text{(Eqn. 3)}$$

$$DAC1+DAC2=X(f)(e^{j\pi f t_d}+e^{-j\pi f t_d}) \quad \text{(Eqn. 4)}$$

$$DAC1+DAC2=2e^{-j\pi f t_d}\cos(\pi f t_d) \quad \text{(Eqn. 5)}$$

The $0.5/F_S$ term due to the 180° phase shift of the interleaving is canceled by shifting the input of DAC2 by $0.5/F_S$ before being sampled, resulting in: $t_d=\varepsilon$. Thus, in the conversion mode:

$$DAC1+DAC2=X(f)2e^{-\pi f t_d}\cos(\pi f \varepsilon) \quad \text{(Eqn. 6)}$$

Figure 8A:
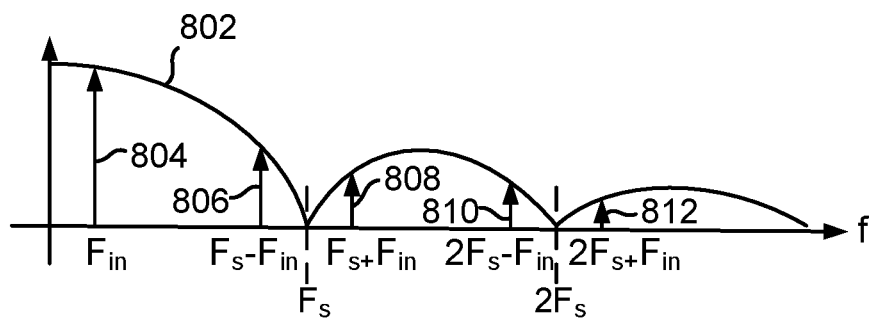
FIG. 8A is a plot of an output waveform of a sum of two sub-DAC outputs.

FIG. 8A illustrates an example of an interleaved DAC output signal 802 when DAC system 600 (FIG. 6) is operating in the conversion mode. Interleaved DAC output signal 802 has an amplitude 804 at the frequency $F_{in}$ of the DAC system input signal. However, due to time skew between DAC1 and DAC2, interleaved DAC output signal 802 includes an interleaved image characterized by an amplitude 806 at a first image frequency $F_S-F_{in}$, an amplitude 808 at a second image frequency $F_S+F_{in}$, an amplitude 810 at a third image frequency $2F_S-F_{in}$, an amplitude 812 at a fourth image frequency $2F_S+F_{in}$, etc. If there were no time skew between DAC1 and DAC2 (e.g., sub-DACs 602 and 604 in FIG. 6), amplitudes 806, 808, 810, 812, etc., would be zero, i.e., the interleaving image would be highly attenuated. The interleaving image attenuation decreases with increasing time skew.

Figure 8B:
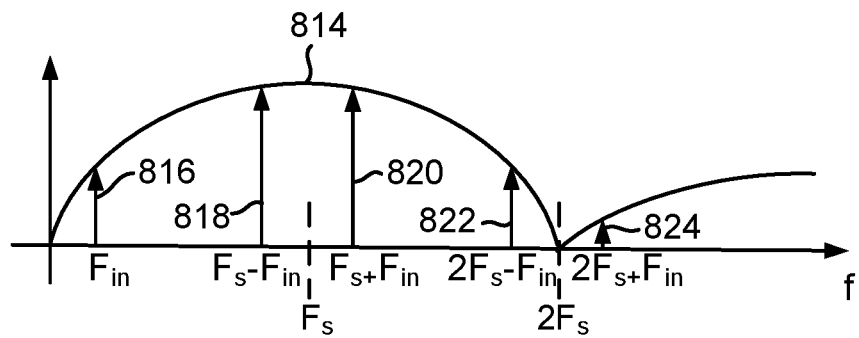
FIG. 8B is a plot of an output waveform of a difference between two sub-DAC outputs.

FIG. 8B illustrates an example of a calibration output signal 814 when DAC system 600 (FIG. 6) is operating in the calibration mode. Calibration output signal 814 has an amplitude 816 at the frequency $F_{in}$ of the DAC system input signal. However, due to time skew between DAC1 and DAC2, calibration output signal 814 includes an interleaved image characterized by an amplitude 818 at a first image frequency $F_S-F_{in}$, an amplitude 820 at a second image frequency $F_S+F_{in}$, an amplitude 822 at a third image frequency $2F_S-F_{in}$, an amplitude 824 at a fourth image frequency $2F_S+F_{in}$, etc. Note that interleaved image amplitudes 818, 820, 822, 824, etc. (FIG. 8B) in the calibration mode are much greater than amplitudes 806, 808, 810, 812, etc. (FIG. 8A) in the conversion mode. That is, in the conversion mode the interleaving image is not highly attenuated.

Accordingly, the interleaving image amplitude resulting from small time skew between DAC1 and DAC2 may be measured readily using economical circuitry.

When interleaved DAC system 600 is operating in the calibration mode:

$$DAC1-DAC2=X(f)(1-e^{-2\pi f t_d}) \quad \text{(Eqn. 7)}$$

$$DAC1-DAC2=X(f)(e^{j\pi f t_d}-e^{-j\pi f t_d}) \quad \text{(Eqn. 8)}$$

$$DAC1-DAC2=2je^{-j\pi f t_d}\sin(\pi f t_d) \quad \text{(Eqn. 9)}$$

As noted above, the $0.5/F_S$ due to the 180° phase shift of the interleaving is canceled by shifting the input of DAC2 by $0.5/F_S$ before being sampled, resulting in: $t_d=\varepsilon$. Thus, in the calibration mode:

$$DAC1-DAC2=X(f)2je^{-j\pi f t_d}\sin(\pi f \varepsilon) \quad \text{(Eqn. 10)}$$

It may be appreciated from equations 6 and 10 that, fundamentally, switching from the conversion mode to the calibration mode converts what in the conversion mode is a time error ε to what in the calibration mode is an amplitude error. The relatively large amplitude error may be measured readily using economical circuitry.

Figure 9:
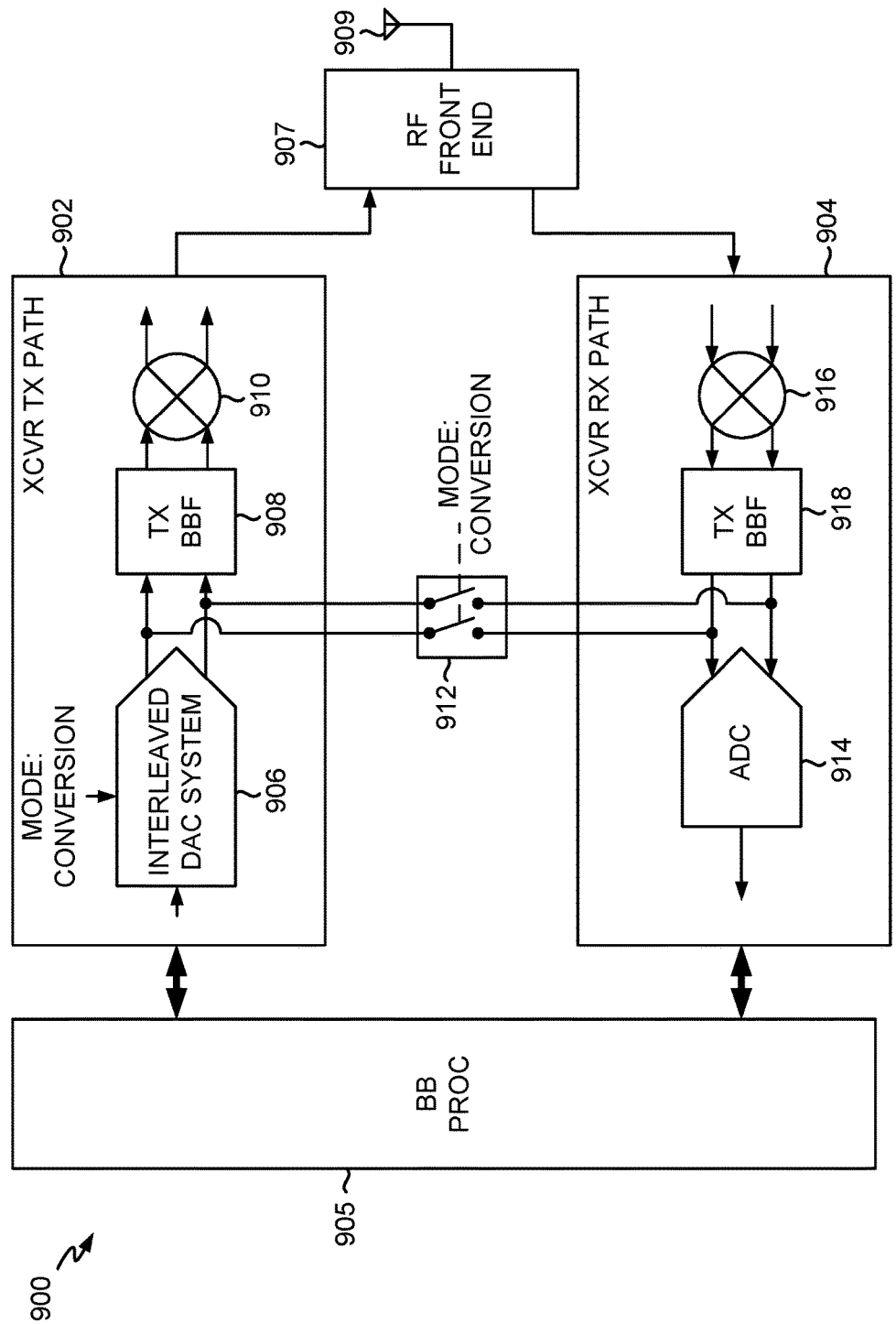
FIG. 9 is a block diagram of a feedback portion of an interleaved DAC system, showing operation in the conversion mode, in accordance with an exemplary embodiment.

FIG. 9 illustrates a portion of a transmit (TX) path (or subsystem) 902 and receive (RX) path (or subsystem) 904 of a wireless communication transceiver (XCVR) device 900. Transmit path 902 and receive path 904 are coupled to a baseband processing system 905, which may include one or more processors and memories (not individually shown). Transmit path 902 and receive path 904 may also be coupled to a RF front end 907 that in turn may be coupled to one or more antennas 909. Wireless communication transceiver device 900 may be of any type, such as, for example, a handset or UE. The wireless communication transceiver device may be a 5G handset that operates at radio frequencies on the order of gigahertz, e.g., a so-called millimeter-wave transceiver. Accordingly, absent the interleaved DAC system disclosed herein, measuring the time error or skew between the sub-DAC outputs may require measurement devices that may be too complex, uneconomical, or otherwise undesirable to include within such a wireless communication transceiver device.

Transmit path 902 includes an interleaved DAC system 906. Interleaved DAC system 906 may be an example of a portion of any of the above-described interleaved DAC systems 400 (FIG. 4), 500 (FIG. 5) or 600 (FIG. 6). Interleaved DAC system 906 may receive a signal to be transmitted from baseband processing system 905, convert that signal to analog format, and provide the analog converter output signal for further transmit path processing in a conventional manner Such further conventional elements of transmit path 902 may include, for example, a baseband filter 908, and a mixer 910. As understood by one of ordinary skill in the art, still other elements may be included in transmit path 902 but are not shown for purposes of clarity. Interleaved DAC system 906 has a mode control input configured in the manner described above with regard to FIGS. 5-7 to receive a mode control signal. Baseband processing system 905 may provide the mode control signal to interleaved DAC system 906. In operation, when the mode control signal indicates the conversion mode, interleaved DAC system 906 provides a converter output signal, and when the mode control signal indicates the calibration mode, interleaved DAC system 906 provides a calibration output signal, in the manner described above with regard to FIGS. 5-7. The converter output signal and calibration output signal may both be provided, multiplexed in response to the mode control signal, at an output of interleaved DAC system 906. Although in the embodiment illustrated in FIG. 9, interleaved DAC system 906 has a differential signal configuration, in other embodiments such an interleaved DAC system may have a single-ended signal configuration.

Wireless communication transceiver device 900 may include a switch 912 controlled by the mode control signal. Switch 912 couples the output of interleaved DAC system 906 to the input of an analog-to-digital converter (ADC) 914 in receive path 904. Switch 912 is configured to close in response to the mode control signal having a state indicating the calibration mode and open in response to the mode control signal having a state indicating the conversion mode. When switch 912 is in the open position, as shown in FIG. 9, wireless communication transceiver device 900 may operate in a conventional manner to transmit and receive radio frequency signals. In mission mode, baseband processing system 905 may provide information (at baseband frequencies) to be transmitted to transmit path 902 and may receive information that has been downconverted (to baseband frequencies) by receive path 904. Such conventional operation may be referred to as "mission mode" to distinguish it from the calibration mode in which a calibration method is performed. In conventional or mission mode operation, ADC 914 is used to convert the analog signal received from other elements of receive path 904. Such other elements may be of conventional types, including, for example, a mixer 916, a filter 918, etc. As understood by one of ordinary skill in the art, still other elements may be included in receive path 904 but are not shown for purposes of clarity.

Figure 10:
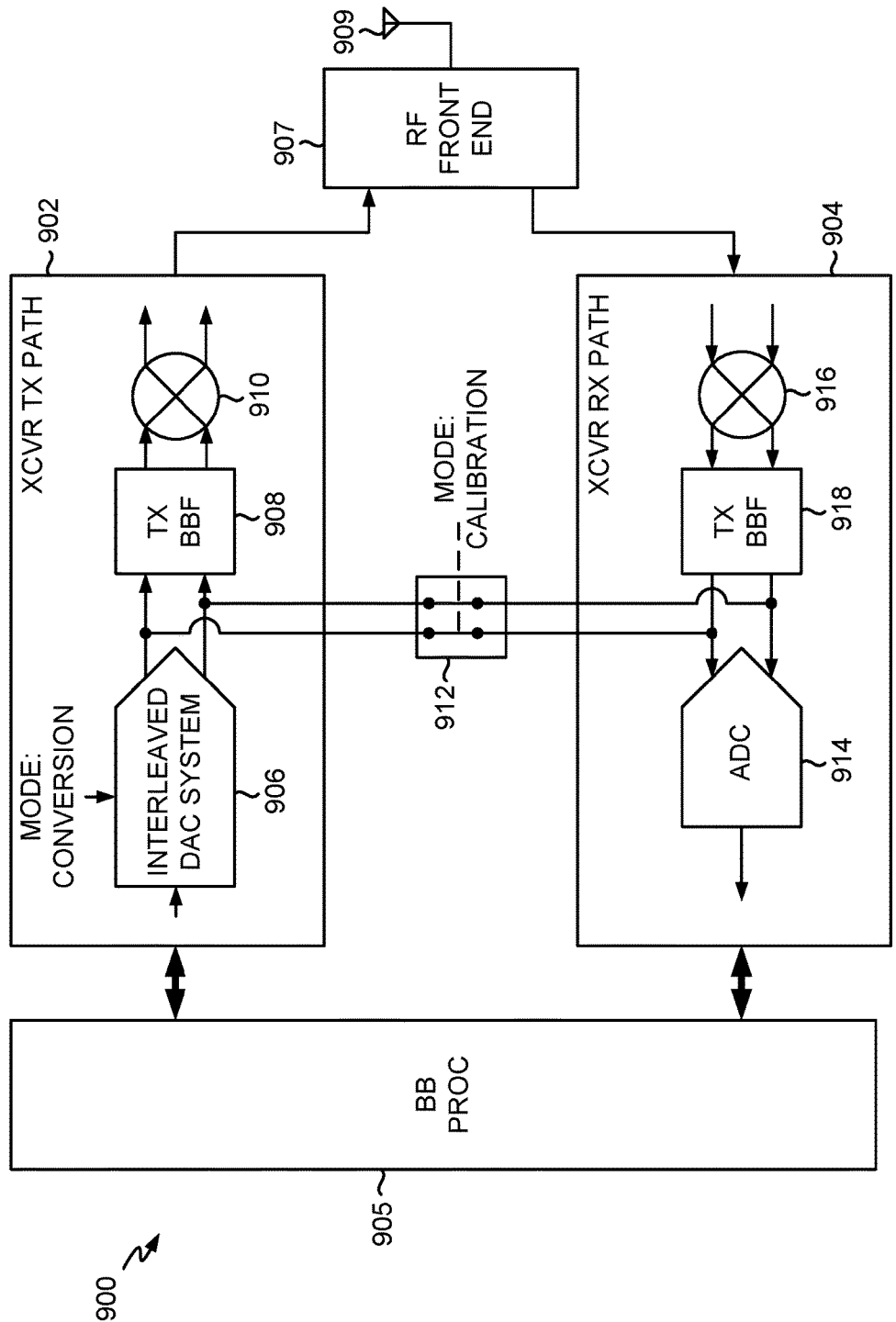
FIG. 10 is a block diagram similar to FIG. 9, showing operation of the feedback portion in the calibration mode, in accordance with an exemplary embodiment.

FIG. 10 illustrates that in response to the mode control signal having a state indicating the calibration mode, the calibration signal is coupled or fed back from the output of interleaved DAC system 906 to the input of an ADC 914. The ADC 914 may thus be used to measure the calibration signal. The ADC 914 may be an example of above-described measurement circuit 508 (FIG. 5). In the calibration mode, baseband processing system 905 may receive the measurement signal from ADC 914. Baseband processing system 905 may adjust one or more delays included in or otherwise associated with interleaved DAC system 906. Although not shown in FIG. 9 for purposes of clarity, such delays may be examples of the above-described delays 408 FIG. 4) and 510 (FIG. 5).

Figure 11:
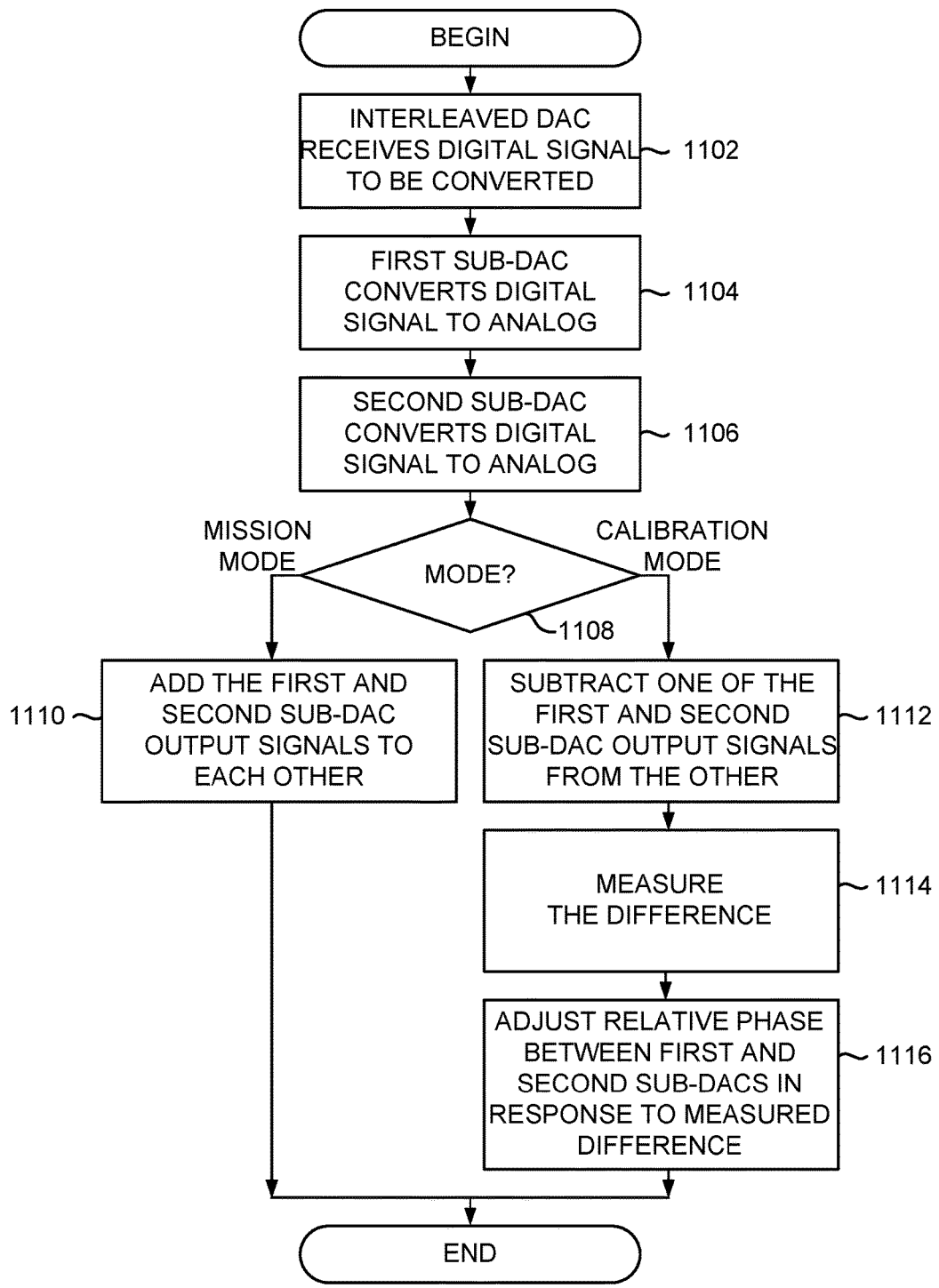
FIG. 11 is a flow diagram illustrating an exemplary method of operation of an interleaved DAC system, in accordance with an exemplary embodiment.

FIG. 11 is a flow diagram illustrating an exemplary calibration method. The exemplary calibration method may be part of a method of operation of an interleaved DAC system, such as any of those described above. The order in which the acts or steps of the exemplary method are described below is intended only to serve as an example. One or ordinary skill in the art recognizes that some acts or steps may occur before, after, or in parallel (i.e., substantially concurrently) with other acts or steps. Further, such acts or steps may be controlled by a processor, such as a processor associated with baseband processing system 905 (FIG. 9). Further, memory associated with baseband processing system 905 is an example of a computer program product comprising a non-transitory computer-readable medium having stored therein in non-transitory computer-executable form, instructions which, when executed by baseband processing system 905, may effect the methods of operation described in this disclosure.

As indicated by block 1102, an interleaved DAC system comprising first and second sub-DACs may receive a signal. The signal received by the interleaved DAC system may be generated by, for example, baseband processing system 905

(FIG. 9) or other source. As indicated by block 1104, the first sub-DAC may convert the signal to a first sub-DAC output signal in response to a clock signal. As indicated by block 1106, the second sub-DAC may convert the signal to a second sub-DAC output signal in response to a complement of the clock signal. The interleaved DAC may, for example, receive and convert the signal in this manner while a mode control signal has a state indicating mission-mode operation. During mission-mode operation, the signal received by the interleaved DAC system may be generated by, for example, baseband processing system 905 (FIG. 9) and may represent information to be transmitted. As indicated by block 1108, when it is determined that the interleaved DAC system is operating in mission mode, the interleaved DAC may provide a converter output signal by adding the first sub-DAC output signal and the second sub-DAC output signal, as indicated by block 1110. Alternatively, the interleaved DAC system may receive and convert the signal in this manner while the mode control signal has a state indicating a calibration mode. During calibration mode operation, the signal received by the interleaved DAC system may be generated by, for example, baseband processing system 905 (FIG. 9) and may be a sine wave (i.e., continuous wave tone).

When it is determined (block 1108) that the interleaved DAC system is operating in calibration mode, the interleaved DAC system may provide a converter output signal by subtracting one of the first sub-DAC output signal and the second sub-DAC output signal from the other of the first sub-DAC output signal and the second sub-DAC output signal. As indicated by block 1114, in the calibration mode the calibration output signal (i.e., the difference between the first and second sub-DAC output signals) may be measured. For example, in an embodiment in which the interleaved DAC system is part of a transmit path of a transceiver, the calibration output signal may be looped back to an ADC of a receive path of the transceiver for measurement. As indicated by block 1116, the relative phase between the first and second sub-DACs may be adjusted in response to the calibration output signal. To adjust the relative phase between the first and second sub-DACs, the clock signal provided to at least one of the sub-DACs may be delayed. The phase may be adjusted in a manner that promotes zero phase difference or time skew. For example, the operations described above with regard to blocks 1108-1116 may be repeated in an iterative manner, with the delay being changed incrementally each iteration, until the phase difference is reduced below a threshold.

Baseband processing system 905 or other control system (not shown) may control the state of the mode control signal. For example, such a control system may switch the state of the mode control signal to indicate the calibration mode and phase-adjust the sub-DACs. Such a control system may switch the state of the mode control signal at any time. For example, such a control system may switch the mode control signal to select the calibration mode and otherwise control the operations described above with regard to blocks 1112-1116 only when the transceiver is inactive, i.e., there is nothing to transmit or receive. Alternatively, such a control system may switch the state of the mode control signal to select the calibration and otherwise control the operations described above with regard to blocks 1112-1116 at predetermined time intervals, predetermined times of day, etc.

Figure 12:
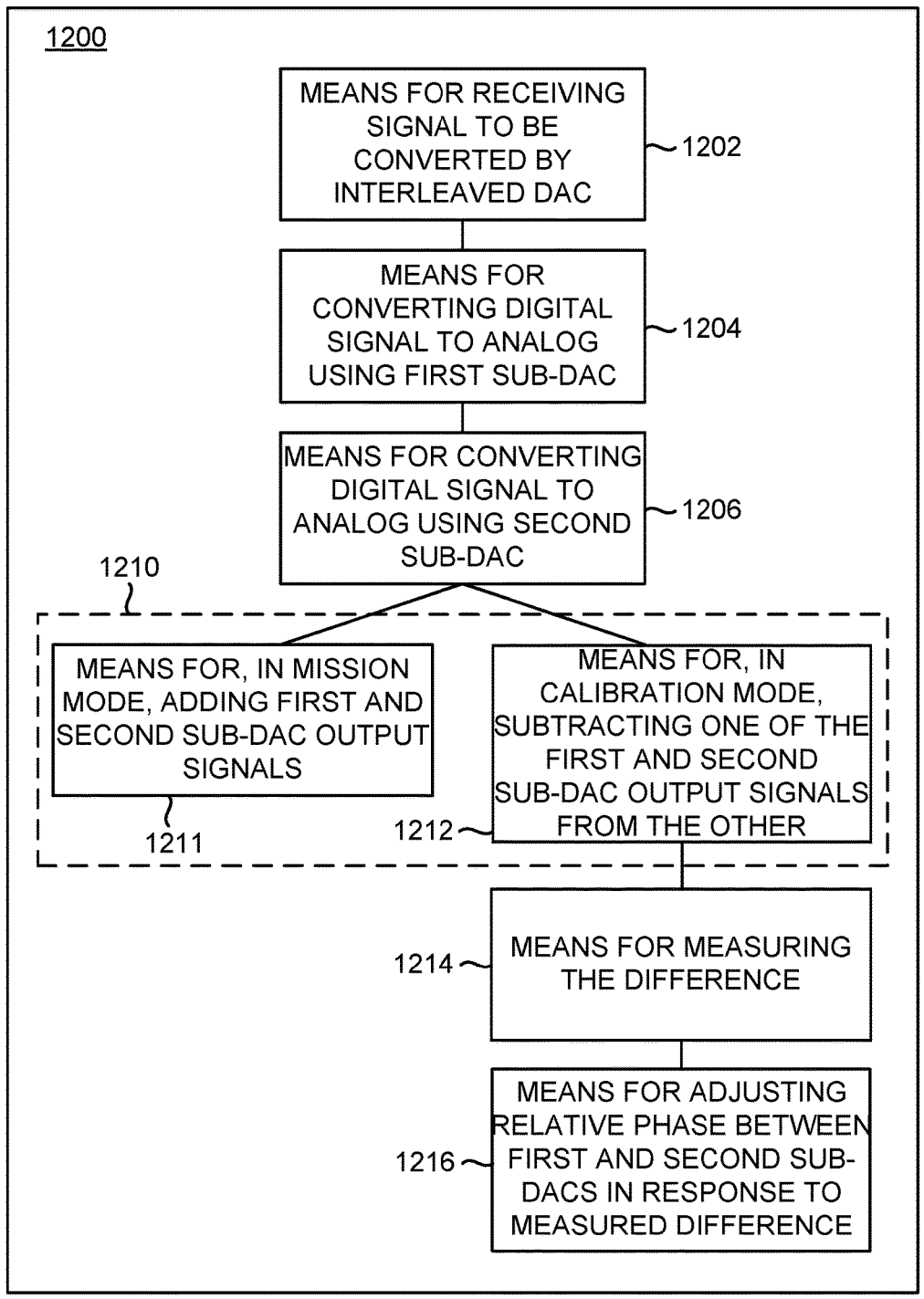
FIG. 12 is a functional block diagram of an interleaved DAC system, in accordance with an exemplary embodiment.

FIG. 12 is a functional block diagram of an interleaved DAC apparatus 1200. Apparatus 1200 may include means 1202 for receiving a digital signal to be converted by an interleaved DAC. Means 1202 may be configured to perform the function described above with regard to block 1102 of FIG. 11. Means 1202 may comprise an input portion of an interleaved DAC system as described above with regard to any of FIGS. 3-7 and 9-10. Apparatus 1200 may also include means 1204 for converting the digital signal to a first sub-DAC output signal in response to a complement of the clock signal. Means 1204 may be configured to perform the function described above with regard to block 1104 of FIG. 11. Means 1204 may comprise a first sub-DAC as described above with regard to any of FIGS. 3-7. Apparatus 1200 may further include means 1210 for providing a converter output signal representing a sum of the first sub-DAC output signal and the second sub-DAC output signal and for providing a calibration output signal representing a difference between the first sub-DAC output signal and the second sub-DAC output signal. Means 1210 may be configured to perform the functions described above with regard to blocks 1108-1112 of FIG. 11. Means 1210 may comprise an output circuit as described above with regard to any of FIGS. 3-7. Means 1210 may comprise a means 1211 for adding the first sub-DAC output signal and the second sub-DAC output signal and a means 1212 for subtracting one of the first and second sub-DAC output signals from the other. Apparatus 1200 may further include means 1214 for measuring the difference between the first and second sub-DAC output signals. Means 1214 may be configured to perform the functions described above with regard to block 1114 of FIG. 11. Means 1214 may comprise a measurement circuit as described above with regard to FIG. 5 or 9-10. Apparatus 1200 may further include means 1216 for adjusting the relative phase between the first and second sub-DACs in response to the calibration output signal. Means 1216 may be configured to perform the functions described above with regard to block 1116 of FIG. 11. Means 1216 may comprise a delay circuit as described above with regard to FIGS. 4-5 and 10.

Figure 13:
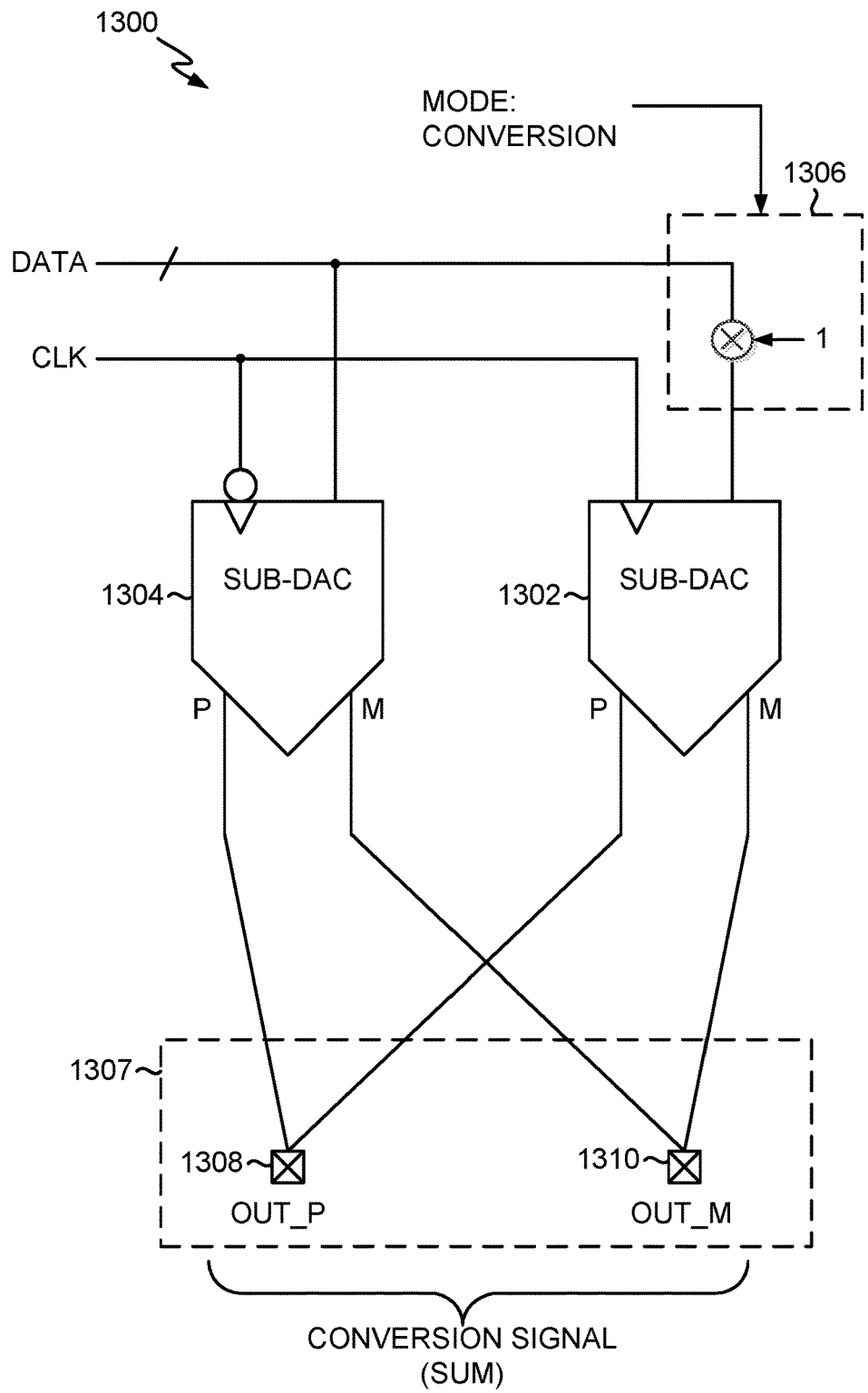
FIG. 13 is a block diagram of another interleaved DAC system, showing operation in a conversion mode, in accordance with an exemplary embodiment.
Figure 14:
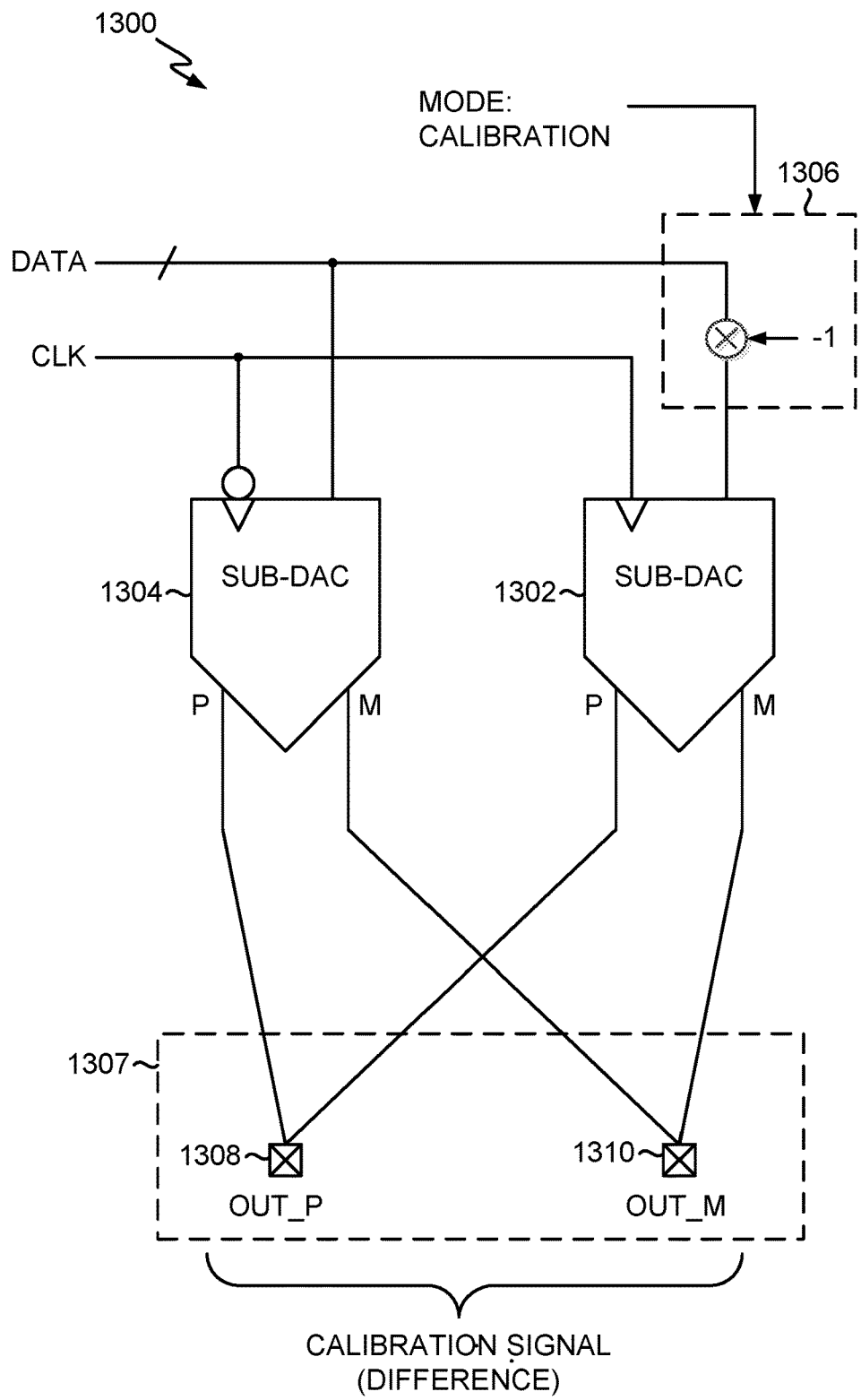
FIG. 14 is a block diagram similar to FIG. 13, showing operation of the DAC system in a calibration mode, in accordance with an exemplary embodiment.

FIGS. 13 and 14 illustrate an alternative interleaved DAC system 1300 that effectively produces the same result as the above-described embodiment of FIGS. 6-7. Interleaved DAC system 1300 includes two sub-DACs 1302 and 1304, an input circuit 1306, and an output circuit 1307. Each of sub-DACs 1302 and 1304 has a data input and a clock signal input. Although not shown for purposes of clarity, the data input may be two or more bits wide. The data input of sub-DAC 1302 is coupled via input circuit 1306 to a digital signal representing an input value, and the data input of sub-DAC 1304 is coupled directly to the digital signal representing the input value. A clock signal is provided to the clock input of one of sub-DACs 1302 and 1304 and to an inverting clock input of the other of the sub-DACs 1302 and 1304. Alternatively, an inverter could be included as described above with regard to FIG. 3. The analog outputs of sub-DACs 1302 and 1304 provide differential current signals, which are summed at output nodes 1308 and 1310. In the embodiment shown in FIGS. 13-14, output circuit 1307 may comprise output nodes 1308 and 1310.

FIG. 14 illustrates the effect of selecting the calibration mode instead of the conversion mode. In response to the mode control signal having a state indicating the calibration mode, input circuit 1306 multiplies the digital input value provided to sub-DAC 1302 by negative one (−1). This multiplication by −1 may be implemented by, for example, inverting the state of the most-significant bit (MSB) of a two's complement binary number or value. Inverting the state of the MSB of a two's complement value changes the sign of the value. In FIG. 14, input circuit 1306 changes the sign of the digital input value provided to sub-DAC 1302 from positive to negative in response to a change in the mode control signal from conversion mode to calibration mode. Thus, with the digital input value provided to sub-DACs 1302 and 1304 having negative and positive signs, respectively, the analog output value from sub-DAC 1302 is effectively subtracted from the analog output value from sub-DAC 1304 at output nodes 1308 and 1310. That is, the current outputs at positive and negative output nodes 1308 and 1310 reflect the difference between the current outputs of sub-DACs 1302 and 1304, which is the same result produced by the above-described embodiment in FIG. 7. It is irrelevant to the result whether the subtraction or difference operation in the calibration mode is performed before or after the digital-to-analog conversion. Referring again to FIG. 13, when the mode control signal has a state indicating the conversion mode, input circuit 1306 may simply multiply the input value provided to sub-DAC 1302 by one.

In view of the foregoing, it can be appreciated that a difficult-to-measure time skew between interleaved DACs may, in effect, be converted to a more readily measurable amplitude error. The measurement may be used to adjust the time skew, with a goal of reducing the time skew to zero.

Therefore, although selected aspects have been illustrated and described in detail, it will be understood that various substitutions and alterations may be made therein without departing from the spirit and scope of the present invention, as defined by the following claims.

What is claimed is:

1. An interleaved digital-to-analog converter (DAC) system, comprising:
   a first sub-DAC having a data input coupled to a digital signal, a clock input configured to receive a clock signal, and a first sub-DAC output configured to provide a first sub-DAC output signal;
   a second sub-DAC having a data input coupled to the digital signal, a clock input configured to receive a complement of the clock signal, and a second sub-DAC output configured to provide a second sub-DAC output signal; and
   an output circuit coupled to the first sub-DAC output and the second sub-DAC output, the output circuit configured to provide a first output signal representing a difference between the first sub-DAC output signal and the second sub-DAC output signal, the output circuit further configured to selectively provide a second output signal representing a sum of the first sub-DAC output signal and the second sub-DAC output signal.

2. The interleaved DAC system of claim 1, wherein: the first and second sub-DAC output signals are differential current signals, and the output circuit comprises a summing circuit configured to sum the differential current signals.

3. The interleaved DAC system of claim 2, further comprising an input circuit configured to couple the digital signal to the first and second sub-DACs in response to a state of a mode control signal indicating a conversion mode and to couple the digital signal and a complement of the digital signal to the first and second sub-DACs, respectively, in response to a state of the mode control signal indicating a calibration mode;
   wherein the first output signal comprises a calibration output signal of the calibration mode and the second output signal comprises a converter output signal of the conversion mode.

4. The interleaved DAC system of claim 3, wherein the output circuit comprises a switching circuit configured to provide the converter output signal in response to the state of the mode control signal indicating the conversion mode and to provide the calibration output signal in response to the state of the mode control signal indicating the calibration mode.

5. The interleaved DAC system of claim 4, wherein the summing circuit is switchable between providing the converter output signal in response to the state of the mode control signal indicating the conversion mode and providing the calibration output signal in response to the state of the mode control signal indicating the calibration mode.

6. The interleaved DAC system of claim 5, wherein the switching circuit comprises a plurality of transistor circuits, each transistor circuit comprising a pair of switchable transistors having inputs coupled together to a current output of one of the first and second sub-DACs and having outputs coupled to current summing nodes.

7. The interleaved DAC system of claim 1, further comprising:
   at least one delay element coupled to at least one input of at least one of the first and second sub-DACs; and
   a measurement circuit configured to measure the first output signal and adjust the at least one delay element in response to a measurement of the first output signal.

8. The interleaved DAC system of claim 7, wherein the measurement circuit comprises a portion of a receive path of a transceiver, and the first and second sub-DACs are included in a transmit path of the transceiver.

9. The interleaved DAC system of claim 8, wherein:
   the output circuit comprises a switching circuit configured to provide the second output signal in response to a state of a mode control signal indicating a conversion mode and to provide the first output signal in response to the state of the mode control signal indicating a calibration mode; and
   the measurement circuit further comprising a loopback switch between the transmit path and receive path operable in response to the state of the mode control signal.

10. An interleaved digital-to-analog converter (DAC) apparatus, comprising:
    means for converting a digital signal to a first sub-DAC output signal in response to a clock signal;
    means for converting the digital signal to a second sub-DAC output signal in response to a complement of the clock signal;
    means for providing a first output signal representing a difference between the first sub-DAC output signal and the second sub-DAC output signal;
    means for providing a second output signal representing a sum of the first sub-DAC output signal and the second sub-DAC output signal; and
    means for switching between the first and second output signals in response to a state of a mode control signal.

11. The interleaved DAC apparatus of claim 10, wherein the means for switching switches to the second output signal in response to the state of the mode control signal indicating a conversion mode and switches to the first output signal in response to the state of the mode control signal indicating a calibration mode.

12. The interleaved DAC apparatus of claim 11, wherein the means for converting provides differential current signals, and the means for switching comprises means for summing the differential current signals.

13. The interleaved DAC apparatus of claim 12, wherein the means for summing the differential current signals comprises:

means for, in response to the state of the mode control signal indicating the conversion mode, summing a positive first sub-DAC current signal and a positive second sub-DAC current signal at a positive DAC output node and summing a negative first sub-DAC current signal and a negative second sub-DAC current signal at a negative DAC output node; and means for, in response to the state of the mode control signal indicating the calibration mode, summing the positive first sub-DAC current signal and the negative second sub-DAC current signal at the positive DAC output node and summing the negative first sub-DAC current signal and the positive second sub-DAC current signal at a negative DAC output node.

14. The interleaved DAC apparatus of claim 10, further comprising:

means for measuring the first output signal;

means for phase-adjusting at least one of the means for converting in response to a measurement of the first output signal.

15. An interleaved digital-to-analog converter (DAC) system, comprising:

a first sub-DAC having a data input configured to receive a digital signal, a clock input configured to receive a clock signal, and a first sub-DAC output configured to provide a first sub-DAC output signal;

a second sub-DAC having a data input configured to receive the digital signal, a clock input configured to receive a complement of the clock signal, and a second sub-DAC output configured to provide a second sub-DAC output signal; and at least one delay element coupled to an input of at least one of the first and second sub-DACs; and a feedback circuit coupled to the first sub-DAC output, the second sub-DAC output, and the at least one delay element, the feedback circuit configured to provide a first output signal in response to a difference between the first sub-DAC output signal and the second sub-DAC output signal and to adjust the at least one delay element in response to the first output signal.

16. The interleaved DAC system of claim 15, wherein the feedback circuit includes a portion of a receive path of a transceiver, and the first and second sub-DACs are included in a transmit path of the transceiver.

17. The interleaved DAC system of claim 16, wherein the feedback circuit comprises a loopback switch between the transmit path and receive path operable in response to a mode control signal.

18. The interleaved DAC system of claim 15, wherein the feedback circuit comprises a switching circuit configured to provide a second output signal representing a sum of the first sub-DAC output signal and the second sub-DAC output signal in response to a state of a mode control signal indicating a conversion mode and to provide the first output signal in response to the state of the mode control signal indicating a calibration mode.

19. The interleaved DAC system of claim 15, wherein the first and second sub-DAC output signals are differential current signals, and the feedback circuit comprises a summing circuit configured to sum the differential current signals.

20. The interleaved DAC system of claim 19, wherein the summing circuit comprises a plurality of transistor circuits, each transistor circuit comprising a pair of switchable transistors having inputs coupled together to a current output of one of the first and second sub-DACs and having outputs coupled to current summing nodes.

21. The interleaved DAC system of claim 20, wherein the plurality of transistor circuits comprises:

a first transistor circuit comprising a first transistor and a second transistor, the first transistor switchably coupled between a positive output of the first sub-DAC and a positive output of the feedback circuit, the second transistor switchably coupled between the positive output of the first sub-DAC and the positive output of the feedback circuit;

a second transistor circuit comprising a third transistor and a fourth transistor, the third transistor switchably coupled between a negative output of the first sub-DAC and a negative output of the feedback circuit, the fourth transistor switchably coupled between the negative output of the first sub-DAC and the negative output of the feedback circuit;

a third transistor circuit comprising a fifth transistor and a sixth transistor, the fifth transistor switchably coupled between a positive output of the second sub-DAC and the positive output of the feedback circuit, the sixth transistor switchably coupled between the positive output of the first sub-DAC and the negative output of the feedback circuit; and a fourth transistor circuit comprising a seventh transistor and an eighth transistor, the seventh transistor switchably coupled between a negative output of the second sub-DAC and the positive output of the feedback circuit, the eighth transistor switchably coupled between the negative output of the second sub-DAC and the negative output of the feedback circuit.

22. A method for operating an interleaved digital-to-analog converter (DAC) system, comprising:

converting a digital signal using a first sub-DAC to a first sub-DAC output signal in response to a clock signal;

converting the digital signal using a second sub-DAC to a second sub-DAC output signal in response to a complement of the clock signal; and providing a first output signal in response to a state of a mode control signal indicating a calibration mode by subtracting one of the first sub-DAC output signal and the second sub-DAC output signal from the other of the first sub-DAC output signal and the second sub-DAC output signal.

23. The method of claim 22, further comprising providing a second output signal by adding the first sub-DAC output signal and the second sub-DAC output signal in response to the state of the mode control signal indicating a conversion mode;

wherein:

providing the second output signal comprises summing first and second sub-DAC differential current signals; and providing the first output signal comprises summing the first and second sub-DAC differential current signals.

24. The method of claim 23, wherein summing the first and second sub-DAC differential current signals comprises switching a plurality of transistors between providing the second output signal in response to the state of the mode control signal indicating the conversion mode and providing the second output signal in response to the state of the mode control signal indicating the calibration mode.

25. The method of claim 24, wherein switching a plurality of transistors comprises switching a plurality of pairs of transistors, each pair of transistors having inputs coupled together to a current output of one of the first and second sub-DACs and having outputs coupled to current summing nodes.

26. The method of claim 25, wherein switching the plurality of pairs of transistors comprises:
   in response to the state of the mode control signal indicating the conversion mode:
      summing a positive first sub-DAC current signal and a positive second sub-DAC current signal at a positive DAC output node;
      summing a negative first sub-DAC current signal and a negative second sub-DAC current signal at a negative DAC output node; and
   in response to the state of the mode control signal indicating the calibration mode:
      summing the positive first sub-DAC current signal and the negative second sub-DAC current signal at the positive DAC output node; and
      summing the negative first sub-DAC current signal and the positive second sub-DAC current signal at a negative DAC output node.

27. The method of claim 23, further comprising:
measuring the first output signal; and
phase-adjusting at least one of the first and second sub-DACs in response to the first output signal.

28. The method of claim 27, wherein:
providing the second output signal comprises opening a loopback switch between a transmit path and a receive path in response to a state of a mode control signal indicating the conversion mode; and
measuring the first output signal comprises closing the loopback switch between the transmit path and the receive path in response to the state of the mode control signal indicating the calibration mode.

29. The method of claim 27, wherein measuring the first output signal comprises using an analog-to-digital converter portion of a receive path of a transceiver, wherein the first and second sub-DACs are included in a transmit path of the transceiver.

* * * * *